United States Patent [19]
Reisner et al.

[11] Patent Number: 5,291,148
[45] Date of Patent: Mar. 1, 1994

[54] GAIN LINEARIZATION WITH COPLANAR WAVEGUIDE

[75] Inventors: Russ A. Reisner, Redondo Beach; Wilbert Copeland; Arnold Berman, both of Los Angeles; Charles C. Curello, Torrance, all of Calif.

[73] Assignee: Hughes Aircraft Company, Los Angeles, Calif.

[21] Appl. No.: 994,833

[22] Filed: Dec. 22, 1992

[51] Int. Cl.$^5$ .......................... H03F 1/26; H03F 3/60
[52] U.S. Cl. ...................................... 330/149; 330/286
[58] Field of Search ................... 330/43, 53, 110, 149, 330/151, 286, 287; 333/161, 164

[56] References Cited
U.S. PATENT DOCUMENTS 5,172,068 12/1992 Childs ............................ 330/149 X Primary Examiner—Steven Mottola
Attorney, Agent, or Firm—Gordon R. Lindeen, III; William J. Streeter; Wanda Denson-Low

[57] ABSTRACT

A predistortion linearizer (20) is operative with a microwave signal, as may be provided by signal source (62) to linearize the gain of a power amplifier, such as a traveling-wave-tube power amplifier (74), by introduction of an amplitude and/or a phase distortion to the microwave signal wherein the distortion is inverse to a distortion introduced by the power amplifier, thereby to compensate for the distortion of the power amplifier. The linearizer is constructed of two channels (22, 24) which are operated in parallel but approximately 180 degrees out of phase, with an additional phase increment provided by delay lines (46, 56) to offset one channel from the other channel by a phase difference in a range of approximately 160–200 degrees. Included within each channel is a diode circuit (40, 50) wherein the diode circuit (40) includes a set of PIN diodes operated in linear fashion in the channel (22), and the diode circuit (50) includes a set of Schottky diodes operated in nonlinear fashion in the channel (24). The limiter diode circuit (50) limits signal amplitude resulting in a gain expansion and a phase advance upon summation of signal vectors of the two channels to provide an output signal. These are adjusted to compensate for the gain compression and phase lag of the power amplifier. In each of the diode circuits, the diodes are mounted on components of a coplanar waveguide for symmetry in construction and avoidance of generation of parasitic reactances.

9 Claims, 3 Drawing Sheets

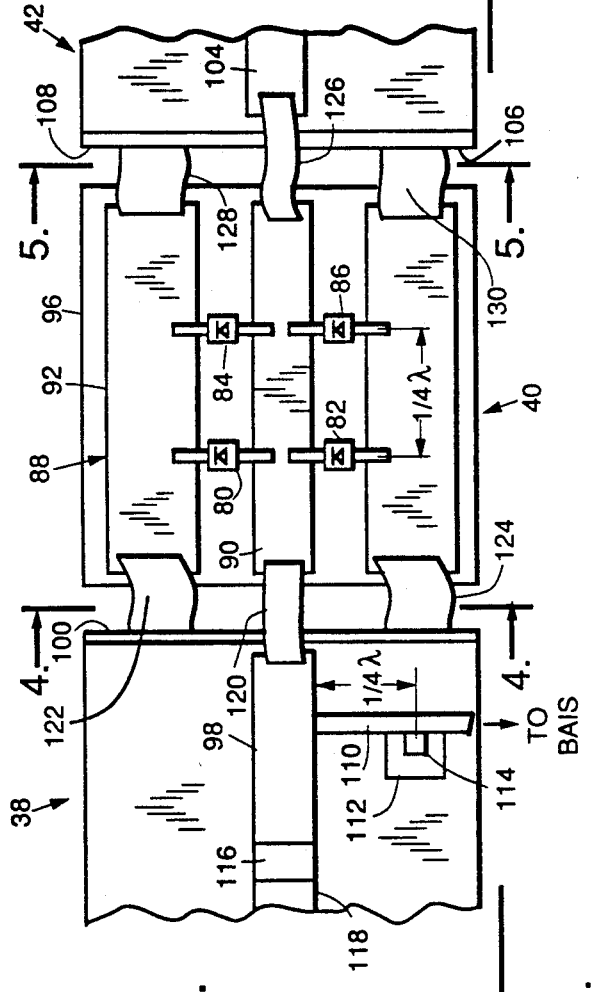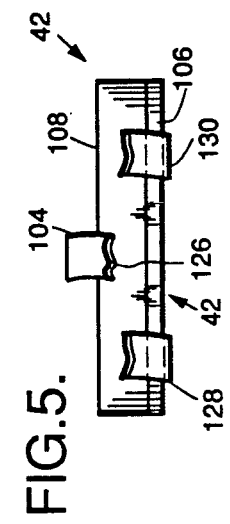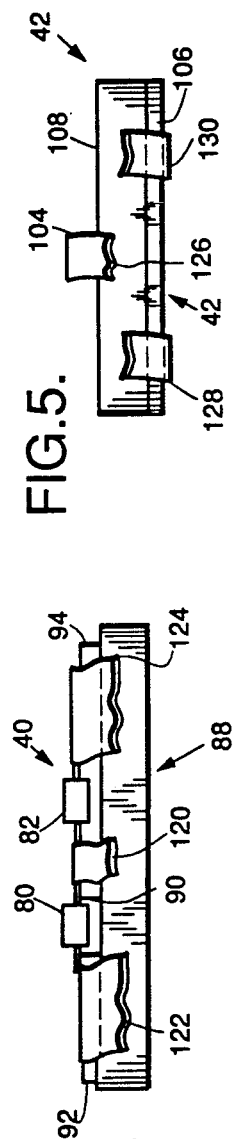

GAIN LINEARIZATION WITH COPLANAR WAVEGUIDE

BACKGROUND OF THE INVENTION

This invention relates to the linearization of the gain and phase transfer characteristics of solid state power amplifiers and traveling wave tube amplifiers, wherein a preceding linearizer circuit is deployed by means of vectorial summation of signals of linear and nonlinear channels having diode circuits constructed by use of coplanar waveguide.

Predistortion linearizers are used in transmitter applications having simultaneous requirements of high efficiency and of low distortion, wherein the low distortion includes a conversion from an amplitude modulated signal to a distorted amplitude modulated signal as well as introduction of unwanted phase modulation from an amplitude modulated signal. These two requirements are generally mutually exclusive since high efficiency is achieved by operating a power amplifier near power saturation, whereas low distortion requires that the operating point be set back from the power-saturation region. Thus, if one were to plot the amplitude of the output signal of a high-gain microwave amplifier versus the input signal, the gain of the amplifier would appear to decrease with increasing input signal amplitude. In addition, the amount of phase shift which is present for a relatively small input signal amplitude would change as the amplifier gain tends to saturate for high input signal levels.

Therefore, there is a problem because existing amplifiers can be employed for linear amplification over only a relatively small range of input signal levels. Operation at saturation, while useful in attaining high values of efficiency suffers from the foregoing forms of signal distortion. A further problem arises in an attempt to build a gain linearization circuit operable at microwave frequencies in that parasitic resonances can occur as a result of the circuit implementation.

SUMMARY OF THE INVENTION

The aforementioned problems are overcome and other advantages are provided by a predistortion linearizer system for linearizing the gain and the phase transfer characteristics of a power amplifier or other electronic device serially connected to a predistortion linearizer of the invention. The linearizer is constructed as a microwave circuit having two channels wherein, in accordance with the invention, at least a portion of each channel is a diode circuit having a set of diodes mounted upon coplanar waveguide and, wherein the diode circuit of one channel is operated in linear fashion and the diode circuit of the other channel is operated in a nonlinear fashion. Bias voltages are provided to the diodes to establish a desired ratio of signal amplitudes between the linear and the nonlinear portions of the microwave circuit. The remaining portions of the two channels may be constructed of other forms of microwave transmission lines such as microstrip or stripline, if desired, with transition elements disposed between the coplanar waveguide transmission line components and the remaining portions of the two channels. A power divider at an input end of the linearizer circuit divides an incoming signal evenly between the two channels, and a power combiner at the output end of the linearizer circuit combines the signals of the two channels.

In accordance with a feature of the invention, the signal of each channel is represented by a vector to produce a resultant vector at an output port of the linearizer circuit, wherein a desired control over the amplitude and the phase of the resultant vector is accomplished by arranging the vectors of the signals of the two channels in a range of approximately 160 degrees to 200 degrees relative to each other. This is accomplished by establishing an initial phase shift of 180 degrees between the signals of the two channels with an introduction of 90 degrees of phase shift at the power splitter at the input end of the linearizer circuit and an introduction of a further 90 degrees of phase shift at the power combiner at the output end of the linearizer circuit. For example, a Lange, or branch-line, coupler employed as the power splitter introduces the requisite 90-degree phase shift at the input end, and a further Lange coupler serving as the power combiner introduces a further 90-degree phase shift at the output end of the linearizer circuit for a total phase shift of 180 degrees between the signals of the two channels. Other forms of microwave couplers having the requisite quadrature relationship between output ports may also be employed, such as a hybrid coupler. Or, alternatively, a coupler introducing a phase shift of 180 degrees may be employed at one end of the linearizer circuit, with a further coupler, having a zero-phase shift contribution, such as a Wilkinson coupler, being employed at the opposite end of the linearizer circuit. In addition, delay-line phase shifters and attenuators are employed in each of the channels to set nominal values of relative amplitude and phase of the signals in the two channels.

The signal inputted to the linearizer is adjusted in amplitude so as to interact with the limiter diode circuit of the nonlinear channel to experience a gain compression during propagation through the nonlinear channel. For example an inputted signal of small magnitude would show no gain compression while an input signal of relatively large magnitude would experience significant gain compression. Thus, by suitable selection of input signal magnitude, a useful amplitude region of gain compression is attained wherein the signal vector of the nonlinear channel shows reduced amplitude and a phase increment relative to the signal vector of the linear channel during instances of high amplitude of the input signal. The signal vectors of the two channels return to their nominal relationship, in terms of amplitude and phase, during instances of relatively small amplitude of the input signal.

Since the signal vectors of the channels are directed in substantially opposite directions, thus resulting in a diminution of the resultant vector, a gain compression of the signal vector of the nonlinear channel results in a gain expansion and phase compensation of the resultant vector of the signal outputted from the linearizer circuit. The gain expansion feature is most useful in compensating for the characteristic of gain compression observed in operation of microwave power amplifiers, such as solid-state power amplifiers and traveling-wave-tube power amplifiers. The linearizer will also produce a phase transfer characteristic, either compressing or expanding, to compensate for the amplifier phase distortion. Such a gain compression and phase distortion at higher signal amplitudes for the power amplifiers introduces the distortion which degrades the signal quality. By placing the linearizer circuit in front of the power amplifier, the linearizer circuit is employed to introduce a distortion which is the inverse of the distortion of the power amplifier, thereby to cancel the distortion of the power amplifier resulting in the outputting of a high-fidelity signal from the power amplifier.

BRIEF DESCRIPTION OF THE DRAWING

The aforementioned aspects and other features of the invention are explained in the following description, taken in connection with the accompanying drawing wherein:

FIG. 2 is a plane view of a fragmentary portion of the linearizer of FIG. 1, the fragmentary portion including a diode circuit in a linear channel of the linearizer;

FIG. 3 is a side elevational view of the fragmentary portion of the linearizer taken along the line 3—3 in FIG. 2;

FIG. 4 is a sectional view of the fragmentary portion taken along the line 4—4 in FIG. 2;

FIG. 5 is a sectional view of the fragmentary portion taken along the line 5—5 in FIG. 2;

DETAILED DESCRIPTION

Figure 1:
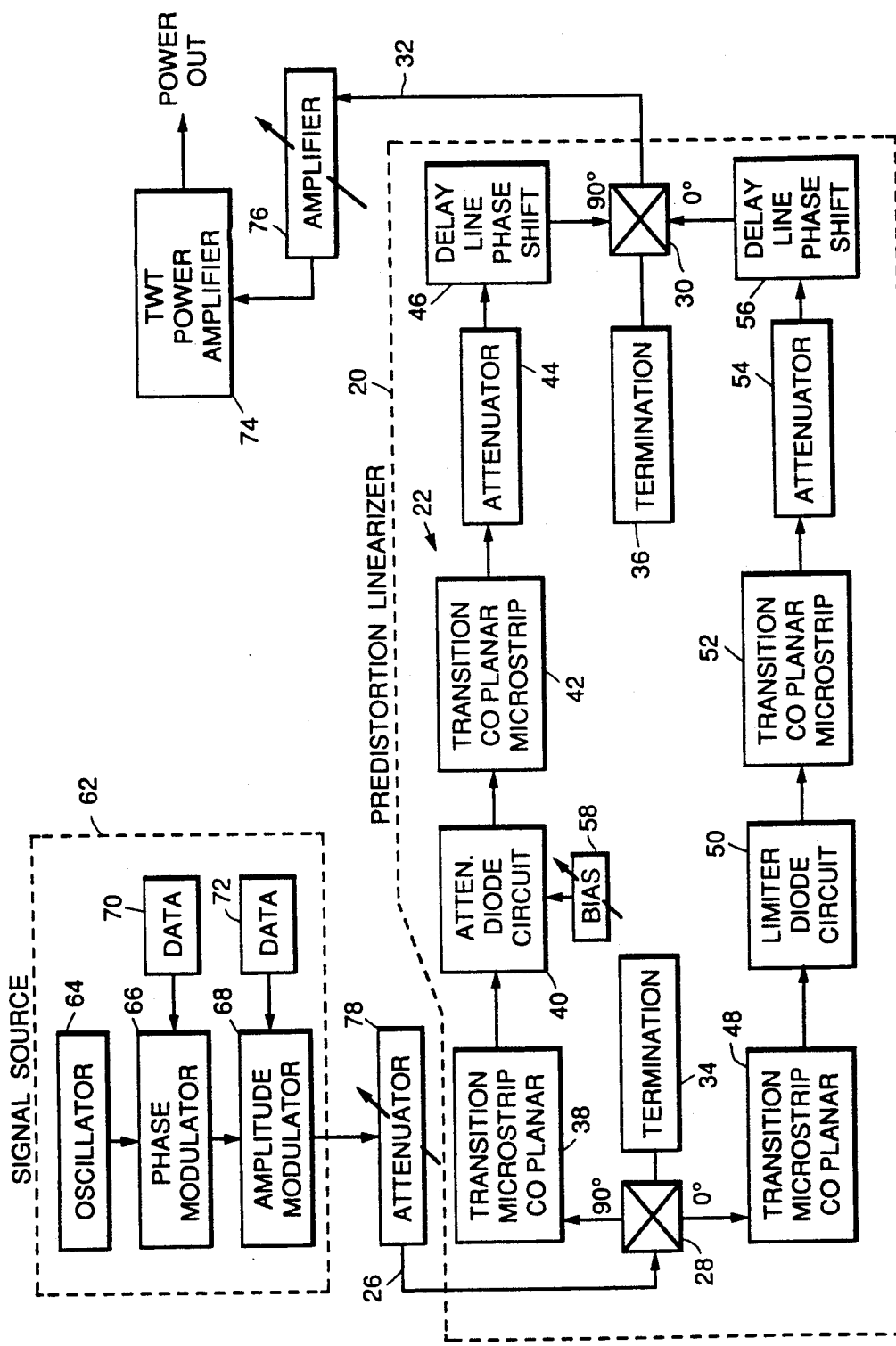
FIG. 1 is a block diagram of a predistortion linearizer constructed in accordance with the invention and coupled between a signal source and a power amplifier.

In FIG. 1, a predistortion linearizer 20 is constructed in accordance with the invention, and includes two channels of identical physical configuration, the two channels being a linear channel 22 and a nonlinear channel 24. An input signal on line 26 is applied to a microwave power divider 28 which divides the power of the input signal equally between the two channels 22 and 24. Signals produced by the channels 22 and 24 are summed together by a microwave power combiner 30 to appear as an output signal of the linearizer 20 on line 32. By way of example, the divider 28 and the combiner 30 may each be fabricated as a microwave coupler, such as a Lange coupler, a branch-line coupler or a hybrid coupler, each of which has the characteristic of introducing a 90-degree phase shift, or quadrature relationship. The quadrature relationship appears between output terminals of the divider 28 and between input terminals of the combiner 30. The fourth terminal of the power divider 28 is terminated by a matched load 34, matched to the transmission-line impedance of the divider 28. In similar fashion, the fourth terminal of the power combiner 30 is also terminated with a matched load 36. Both the divider 28 and the combiner 30 are fabricated, in a preferred embodiment of the invention, as monolithic integrated circuits in microstrip form, for convenience in construction of the linearizer 20. However, if desired, the power divider 28 and the power combiner 30 may be constructed in the form of stripline or in the form of coplanar waveguide.

The linear channel 22 comprises a microwave transition 38 from microstrip transmission line to coplanar waveguide, an attenuator diode circuit 40 having a set of four diodes mounted on a coplanar waveguide (FIGS. 2-5), a transition 42 from coplanar waveguide to microstrip transmission line, a fixed attenuator 44, and a delay line 46 for introducing a phase shift to the signal produced by the channel. The nonlinear channel 24 similarly comprises a microwave transition 48 from microstrip transmission line to coplanar waveguide, a limiter diode circuit 50 having a set of four diodes mounted on a coplanar waveguide, a transition 52 from coplanar waveguide to microstrip transmission line, a fixed attenuator 54, and a delay line 56 for introducing a phase shift to the signal produced by the channel. Each of the four diodes of the attenuator diode circuit 40 is a PIN diode and each of the four diodes of the limiter diode circuit 50 is a Schottky diode. The attenuator diodes of the circuit 40 are provided with bias voltage and current from a bias circuit 58. While a bias current might be applied to the limiter circuit 50 for adjustment of diode parameters, good performance of the linearizer 20 has been obtained without such bias current. Accordingly, no bias circuit is shown for the limiter diode circuit 50. The RF configuration of the two channels 22 and 24 is identical, the only differences between the two channels 22 and 24 being in the types of diodes used in the circuits 40 and 50, the length of the delay lines 46 and 56, and the attenuation values of the attenuators 44 and 54. The equality of the physical arrangement of the components of the two channels, and the mounting of the diodes on coplanar waveguide, insures that relative phase shifts and amplitude shifts of the signals of the two channels can be controlled precisely with minimization of parasitic reactances.

A signal source 62 provides the input signal on line 26. The source 62 provides a microwave signal having data, such as digital or analog data, modulated onto a carrier by phase modulation, frequency modulation, and/or amplitude modulation. By way of example, the signal source 62 may comprise an oscillator 64, a phase modulator 66, an amplitude modulator 68, and sources 70 and 72 of data. The oscillator 64 provides a microwave carrier which is applied to the modulators 66 and 68 to be outputted from the source 62 as a modulated microwave signal. Data from the source 70 is modulated as a phase modulation upon the carrier by the modulator 66, and data of the source 72 is modulated as an amplitude modulation upon the carrier by the modulator 68. By way of example in the microwave frequency, the microwave carrier may have a frequency in the range of UHF band to K band, a typical frequency of operation being 12 GHz (gigahertz). While the principles of the invention are described with reference to a microwave signal, it is to be understood that the principles of the invention apply also to frequencies which are lower than, as well as higher than the foregoing microwave frequencies.

As an example in the use of the linearizer 20, the linearizer 20 drives a traveling-wave-tube (TWT) power amplifier 74 via a variable-gain driver amplifier 76 connected to line 32. A characteristic of the power amplifier 74 is manifested in a reduced gain with input signals of increased amplitude, and also an increasing phase lag with signals of increased amplitude. This is a nonlinear effect of the power amplifier 74 which introduces distortion to a signal amplified by the amplifier 74.

In accordance with the principles of the invention, the predistortion linearizer 20 introduces a distortion which is inverse to the distortion introduced by the power amplifier 74 in order to compensate for the distortion of the amplifier 74. Therefore, as will be explained in further detail hereinafter, the linearizer 20 acts to increase the signal gain in the presence of increased signal amplitude, and to introduce an increasing phase lead with increasing signal amplitude. Upon a balancing of the inverse distortion of the linearizer 20 to the distortion of the power amplifier 74, the series combination of the linearizer 20 and the power amplifier 74 provides for linear amplification, essentially free of distortion, in which the amplification of the signal is the same for all values of signal amplitude, and for which the phase shift is constant for all values of signal amplitude within the operating ranges of the linearizer 20 and the power amplifier 74. The signal provided by the source 62 is coupled to the linearizer 20 by a variable attenuator 78 to place the magnitude of the input signal line 26 within the operating range of the linearizer 20. Similarly, the gain of the amplifier 76 is adjusted to place the output signal of the linearizer 20, on line 32, within the operating range of the power amplifier 74.

FIGS. 2–5 show details in the construction of the attenuator diode circuit 40, it being understood that the description of FIGS. 2–5 applies also to the construction of the limiter diode circuit 50 which is the same as the diode circuit 40, as noted hereinabove, except for the substitution of different types of diodes. The diode circuit 40 comprises a set of four diodes 80, 82, 84, and 86 supported by elements of a coplanar waveguide 88. The coplanar waveguide 88 comprises a center conductor 90 disposed between and spaced apart from two side conductors 92 and 94 wherein the conductors 90, 92 and 94 are deposited by photolithographic techniques upon a dielectric substrate 96. By way of example, the substrate may be fabricated of a ceramic such as alumina, and the conductors 90, 92 and 94 may be fabricated of metallic foil such as copper foil having a thickness of 0.2 mil. The alumina substrate has a thickness of 15 mils.

Each of the side conductors 92 and 94 is at ground potential, while the center conductor 90 has a non-zero value of potential to provide bias voltage and current to the diodes 80, 82, 84 and 86. The diodes 80 and 82, as well as the diodes 84 and 86, are located in a plane transverse to the longitudinal direction of the center conductor 90 and are constructed preferably, as a matched pair having identical, or nearly identical characteristics. The diodes are poled in symmetrical fashion for receiving the bias voltage such that, by way of example, the anodes of the diodes 80 and 82, as well as the anodes of the diodes 84 and 86, are connected to the center conductor 90, while the cathodes of the diodes 80 and 84 are connected to the side conductor 92, and the cathodes of the diodes 82 and 86 are connected to the side conductor 94. The foregoing connection provides that the diodes 84 and 86, as well as the diodes 80 and 82, of the limiter circuit are connected antiparallel, this being a preferred arrangement. The diodes 84 and 86 are spaced one-quarter of a wavelength apart from the diodes 80 and 82. The diodes have a packaging in the form of a beam-lead diode wherein the distal ends of the leads rest upon the conductors of the coplanar waveguide. This arrangement of the diodes 80, 82, 84 and 86 relative to the conductors of the coplanar waveguide minimizes development of parasitic capacitance and inductance, and insures that any impedance introduced to the transmission line of the coplanar waveguide by any one of the diodes is the same as that introduced by any of the other diodes in order to preserve symmetry in the electrical characteristic of the transmission line, and to insure reproducibility of the transmission line characteristics upon manufacture of numerous ones of the linearizers 20.

The transition 38 includes a microstrip transmission line having a center conductor 98 disposed parallel to, and in spaced-apart relation to a ground plane formed as a metallic layer 100, with a dielectric layer 102 being disposed between and serving as a substrate for the center conductor 98 and the metallic layer 100. The transition 42 has a construction similar to that of the transition 38, and includes a center conductor 104 and a metallic, ground-plane layer 106 disposed on opposite sides of a dielectric layer 108 which serves as a substrate for the transition 42.

The bias voltage from the bias circuit 58 is conducted via an auxiliary transmission line 110 formed as an additional strip conductor upon the dielectric layer 102, and extending perpendicularly from the center conductor 98. At a distance of one-quarter of a wavelength from the center conductor 98, the transmission line 110 is connected to ground via a bypass capacitor 112 which extends through the dielectric layer 102 to the metallic, ground-plane layer 100. Connection of the capacitor 112 to the strip conductor of the transmission line 110 is made via a terminal 114 at a top of the capacitor 112. Electrically, the capacitor 112 appears as a RF (radio frequency) short circuit which is reflected back along the transmission line 100 to appear as an open circuit at the center conductor 98. The capacitor 112 allows the direct current of the bias circuit 58 to propagate unimpeded to the center conductor 98 while preventing leakage of an RF signal from the microstrip transmission line of the transition 38 to the bias circuit 58.

A blocking capacitor 116 separates the center conductor 98 from a continuation 118 of the center conductor, the capacitor 116 providing for a gap between the conductor 98 and its continuation 118 to block the direct current and voltage of the bias circuit 58 from the continuation 118 of the center conductor, while allowing for the propagation of an RF signal between the new portions 118 and 98 of the center conductor. Electrical connection between the center conductor 98 of the transition 38 and the center conductor 90 of the coplanar waveguide 88 is provided by a metallic ribbon 120. Additional metallic ribbons 122 and 124 provide electrical connection from the ground-plane layer 100 to respectively the side conductors 92 and 94. Similar electrical connections are made between the microstrip transmission line of the transition 42 to the coplanar waveguide 88 wherein a ribbon 126 provides electrical connection between the center conductor 104 of the transition 42 and the center conductor 90 of the coplanar waveguide 88, and wherein additional ribbons 128 and 130 extend from the ground-plane layer 106 to respectively the side conductors 92 and 94 of the coplanar waveguide 88.

In operation, and with reference to FIGS. 1–9, the microwave couplers of the power divider 28 and the power combiner 30 introduce a 180 degree phase shift between signals of the channels 22 and 24. The delay lines 46 and 56, each of which comprises a relatively short length of microstrip transmission line, introduce an additional phase increment between the channels 22 and 24 so that the nominal value of phase differential between output signals of the two channels is either 160 degrees or 200 degrees, by way of example.

Figure 6:
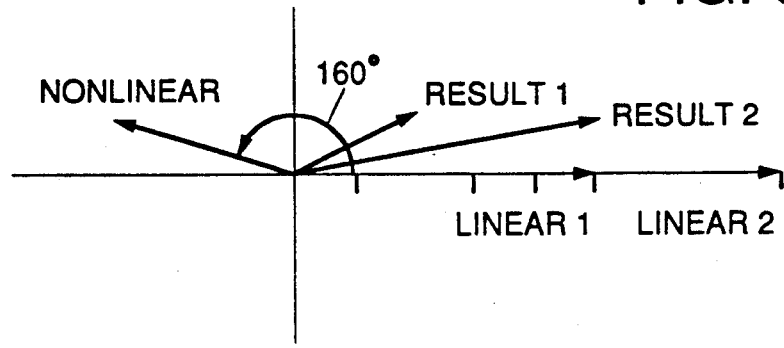
FIG. 6 is a vector diagram demonstrating combination of signals of two channels of the linearizer of FIG. 1 for the case wherein the linearizer provides gain expansion and phase compression (retardation)

This relationship between the two signals of the channels 22 and 24 is portrayed pictorially in FIG. 6 wherein two relatively small signals of equal amplitude (identified by the vector LINEAR 1) are applied to the two channels of the linearizer 20 which produces a resultant signal represented by a resultant vector (RESULT 1). The vector RESULT 1 has a phase shift relative to the vector LINEAR 1. In this small signal case, the signal amplitude is understood to be below the threshold of the limiter diode circuit 50 of the nonlinear channel 24 of the linearizer 20. Upon increasing the amplitudes of the two signals to a larger value shown by the vector LINEAR 2, large enough to exceed the threshold of the limiter diode circuit 50, the linearizer 20 produces the resultant vector (RESULT 2). The vector RESULT 2 has a larger magnitude but smaller phase angle than does the vector RESULT 1. The increased magnitude of the resultant signal is not proportional to the increase in signal amplitude because of the nonlinear action of the channel 24. The contribution to the resultant signal due to the nonlinear operation of the linearizer 20 is represented by the vector NONLINEAR in FIG. 6. The vector NONLINEAR has a phase angle of 160 degrees in this example.

Figure 7:
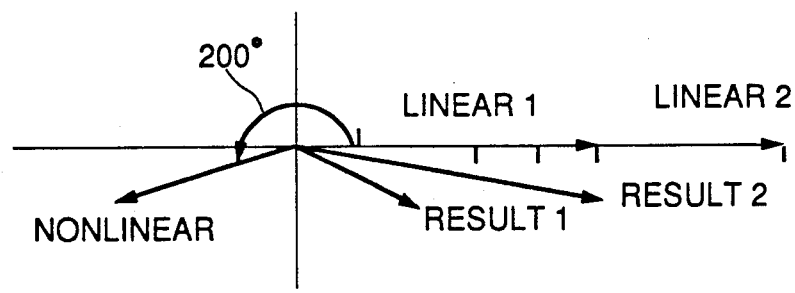
FIG. 7 is a vector diagram, similar to the diagram of FIG. 6, the diagram of FIG. 7 portraying vectors for the case wherein the linearizer provides gain expansion and phase expansion (advancement)

FIG. 7 shows a situation similar to that of FIG. 6, and involving the same input signals to the two channels 22 and 24 as disclosed in FIG. 6. However, in FIG. 7, the relative delays of the delay lines 46 and 56 are selected to provide a phase shift of 200 degrees to the vector NONLINEAR. As a result, the vector RESULT 2 has a greater phase delay than the vector RESULT 1, this being the reverse of the situation of FIG. 6. The operation of the linearizer 20, as depicted in FIG. 7 may be described as a gain expansion with phase expansion, or advancement, and is suitable for linearizing a traveling-wave-tube amplifier such as the power amplifier 74. However, in a case wherein the power amplifier 74 is fabricated as a solid state power amplifier, then the linearizer 20 would be operated in accordance with the operation of FIG. 6 which may be described as a gain expansion with phase compression, or retardation. This demonstrates, that by selecting the relative magnitudes of the vectors representing the signals of the two channels 22 and 24 by operation of the bias circuit 58 (FIG. 1) and by initializing the attenuations of the attenuators 44 and 54 and the phase shifts of the delay lines 46 and 56, the linearizer 20 can provide a distortion which is substantially matched inversely to the distortion of a power amplifier, or other device having a similar type of distortion which is to be compensated.

In the operation of the linearizer 20, in the absence of any bias current from the circuit 58, the PIN diodes of the attenuator circuit 40 introduce relatively little attenuation to the signal of the linear channel 22 while, for the same amplitude of input signal, which is presumed to be above the limiting threshold, the Schottky diodes of the circuit 50 limit the signal amplitude. Changing the bias current from the circuit 58 to the attenuator circuit 40 varies the amount of the attenuation and, thereby serves to tune the linearizer 20. The electrical characteristics of the PIN diode differs from that of the Schottky diode in that the knee of the nonlinear curve of diode current versus diode voltage of the Schottky diode occurs for smaller values of voltage and current (the breakpoint voltage and breakpoint current) than is the case for the PIN diodes of the circuit 40. This provides for a larger range of signal amplitude in the linear channel 22 than to the signal of the nonlinear channel 24. To obtain the benefit of the invention, the linear amplitude range of the linear channel should be greater by at least a factor of three than of the nonlinear channel, the range of the nonlinear channel being limited by the threshold of the limiter diode circuit 50.

It has been found that an optimal relationship in the magnitudes of the two vectors of the signals of the linear channel 22 and the nonlinear channel 24 is within a range of ratios from 1:1 to 1:3 wherein the first and the second digits of the ratio represent, respectively, the signal amplitude of the nonlinear channel 24 and the signal amplitude of the linear channel 22. In order to bring the two signals into the desired range of amplitude ratios, it is necessary to attenuate the signal propagating through the attenuator diode circuit 40. This is accomplished by applying a bias current to the diodes of the diode circuit 40 by the bias circuit 58.

The attenuators 44 and 54 provide for initial adjustment in the magnitudes of the signals outputted by the two channels 22 and 24. It is noted also that the relative amplitudes and phases of the signals outputted by the two channels 22 and 24 are independent of the sequential arrangement of components in each of the channels 22 and 24 such that, if desired, in either one or both of the channels 22 and 24, the attenuator and the delay line could be located in front of the diode circuit rather than behind the diode circuit. For example, in the channel 22, the attenuator 44 and the delay line 46 could be placed between the power divider 28 and the transition 38, rather than after the transition 42 as shown in FIG. 1. It is noted that the linearizer 20 is reciprocal in its operation such that a signal could be inputted on line 32 and outputted on line 26.

Figure 8:
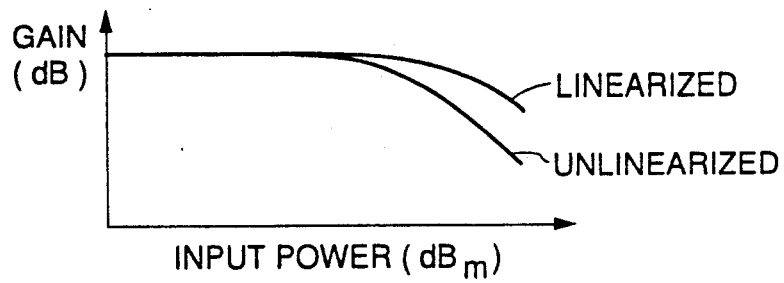
FIG. 8 is a graph showing a typical gain characteristic of a linearized amplifier as compared to an unlinearized amplifier.
Figure 9:
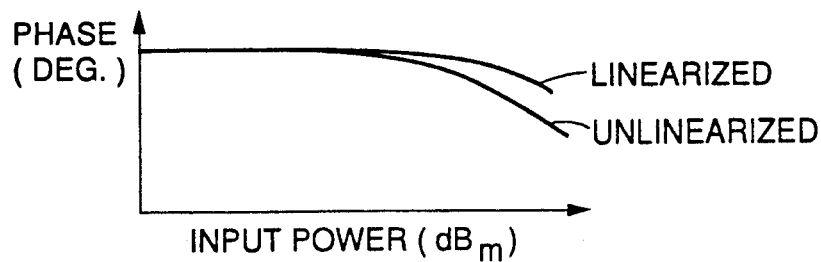
FIG. 9 is a graph showing a typical phase characteristic of a linearized amplifier as compared to an unlinearized amplifier.

FIGS. 8 and 9 demonstrate graphically the effect of the distortion introduced by the TWT amplifier 74 and the correction resulting by use of the linearizer 20. In FIG. 8, the gain of the amplifier 74 is essentially constant with increasing values of input power, but begins to roll off with higher amounts of input power, this being the unlinearized situation. However, upon connection of the linearizer 20 to the amplifier 74, the gain remains essentially constant for a larger range of input signal power. Similarly, in FIG. 9, the phase of the amplifier 74 is essentially constant with increasing values of input power, but begins to roll off with higher amounts of input power, this being the unlinearized situation. However, upon connection of the linearizer 20 to the amplifier 74, the phase remains essentially constant for a larger range of input signal power. Thereby, the linearizer 20 has compensated for the distortion of the power amplifier 74 to provide a desired linear gain throughout the amplification range of the series combination of the linearizer 20 with the amplifier 74.

By way of an alternative embodiment of the invention, it is possible to employ a directional coupler in the power divider 28 providing for unequal division of power such that the signal applied to the linear channel 22 is higher in amplitude than the signal applied to the nonlinear channel 24, thereby to provide the desired ratio of signal amplitudes in the two channels. In such case, it is not necessary to provide the bias current and voltage to the diode circuit 40 for attenuating the signal of the linear channel 22, and the linearizer 20 can be operated without the bias circuit 58.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

What is claimed is:

1. A linearizer comprising:
   a first signal channel and a second signal channel, a power divider and a power combiner, said power divider receiving an input signal and dividing power of the input signal between said first and said second channels, said power combiner combining a signal of said first channel with a signal of said second channel to produce an output signal;
   a first diode circuit disposed in said first channel and being operative in a linear fashion, and a second diode circuit disposed in said second channel and being operative in a nonlinear fashion, each of said diode circuits comprising coplanar waveguide and a set of four diodes mounted upon said coplanar waveguide, in each of said diode circuits there being a first and a second of said diodes connected electrically between a center conductor of said coplanar waveguide and a first side conductor of said coplanar waveguide and a third and a fourth of said diodes connected electrically between said center conductor of said coplanar waveguide and a second side conductor of said coplanar waveguide, an arrangement of said diodes of said first diode circuit being the same as an arrangement of said diodes of said second diode circuit; and
   wherein the diodes of said first diode circuit have different electrical characteristics than the diodes of said second diode circuit to provide for a larger linear range encompassing a larger range of signal amplitude to the signal of said first channel than to the signal of said second channel, the linear range being greater by at least a factor of three.

2. A linearizer according to claim 1 further comprising bias means connected to the diodes of at least one of said diode circuits to provide for adjustment of the relative amplitudes of signals propagating through said first and said second channels wherein the ratio of amplitude of the signal of said first channel to the amplitude of the signal of said second channel is in a range of approximately from 1:1 to 3:1, said range of amplitude ratios allowing for a vectorial combination of the signals of said first and said second channels providing for a distortion of the output signal characterized by gain expansion and phase shift to compensate for a distortion of an electrical device driven by said linearizer.

3. A linearizer according to claim 2 wherein said power divider and said power combiner introduce a phase shift of 180 degrees between signals of said first and said second channels, said linearizer further comprising delay means for introducing a delay between signals of said first and said second channels contributing a phase increment of approximately plus or minus twenty degrees.

4. A linearizer according to claim 3 wherein said power divider and said power combiner are constructed in microstrip or stripline, said linearizer further comprising in each of said channels a transition between coplanar waveguide and microstrip or stripline.

5. A linearizer according to claim 4 further comprising attenuator means for adjusting the relative amplitudes of the signals of said first and said second channels.

6. A linearizer according to claim 5 further comprising means coupled to an input port of said power divider to adjust the amplitude of the input signal to fall within an operating range of said linearizer, and means coupled to an output port of said power combiner to adjust the amplitude of the output signal to fall within an operating range of the electrical device driven by said linearizer.

7. A linearizer according to claim 6 wherein the diodes of said first diode circuit are PIN diodes, and the diodes of said second diode circuit are Schottky diodes.

8. A linearizer according to claim 7 wherein, the signals of said first channel and of said second channel are electromagnetic waves having equal wavelengths and, in each of said diode circuits, said first and said second diodes are spaced apart by a quarter of said wavelength.

9. A linearizer according to claim 8 wherein, in each of said diode circuits, said first and said third diodes are arranged in a plane transverse to a longitudinal direction of said coplanar waveguide and said second and said fourth diodes are arranged in a further plane transverse to the longitudinal direction of said coplanar waveguide.

* * * * *